United States Patent
Ghosh et al.

(10) Patent No.: US 12,273,104 B2
(45) Date of Patent: Apr. 8, 2025

(54) METHODS AND APPARATUS TO CONVERT ANALOG VOLTAGES TO DELAY SIGNALS

(71) Applicant: Texas Instruments Incorporated, Dallas, TX (US)

(72) Inventors: Sovan Ghosh, Bengaluru (IN); Visvesvaraya Appala Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 88 days.

(21) Appl. No.: 18/115,657

(22) Filed: Feb. 28, 2023

(65) Prior Publication Data

US 2024/0291484 A1  Aug. 29, 2024

(51) Int. Cl.
*H03K 5/01* (2006.01)
*H03K 17/687* (2006.01)
*H03K 5/00* (2006.01)
*H03M 1/12* (2006.01)

(52) U.S. Cl.
CPC ........... *H03K 17/6872* (2013.01); *H03K 5/01* (2013.01); *H03K 2005/00078* (2013.01); *H03M 1/12* (2013.01)

(58) Field of Classification Search
CPC ................. H03K 17/6872; H03K 5/01; H03K 2005/00078; H03M 1/12
USPC ........................................................ 327/261
See application file for complete search history.

(56) References Cited

U.S. PATENT DOCUMENTS

| | | | |
|---|---|---|---|
| 8,390,488 B2 * | 3/2013 | Kiran ..................... | G11C 27/02 341/161 |
| 10,341,082 B1 * | 7/2019 | Balakrishnan ......... | H03K 23/66 |
| 11,316,525 B1 * | 4/2022 | Pentakota ............. | H03M 1/109 |
| 2011/0006933 A1 * | 1/2011 | Nagarajan ........... | H03M 1/1057 341/118 |
| 2011/0102033 A1 * | 5/2011 | Pentakota ............ | H03L 7/0802 327/157 |

(Continued)

OTHER PUBLICATIONS

Texas Instruments Incorporated, "U.S. Patent Application," filed with the United States Patent and Trademark Office as U.S. Appl. No. 18/115,657, filed Feb. 28, 2023, 46 pages.

(Continued)

*Primary Examiner* — Ryan Jager
(74) *Attorney, Agent, or Firm* — Valerie M. Davis; Frank D. Cimino

(57) ABSTRACT

An example apparatus includes a first transistor configured to receive an analog voltage signal; a second transistor configured to receive a first control signal, coupled to the first transistor, and coupled to a first terminal; a third transistor configured to receive a second control signal, receive a supply voltage, and coupled to the first terminal; a capacitor coupled to the first terminal and to ground; a fourth transistor configured to receive a third control signal and coupled to the first terminal; a fifth transistor gate configured to receive a bias voltage, coupled to ground, and coupled to the fourth transistor; a sixth transistor coupled to the fourth transistor and to ground; a seventh transistor configured to receive the supply voltage, coupled to the first terminal and to the sixth transistor; and an eighth transistor coupled to the first terminal, to the sixth transistor, and to ground.

20 Claims, 9 Drawing Sheets

(56) References Cited

U.S. PATENT DOCUMENTS

2012/0049951 A1* 3/2012 Venkataraman ..... G11C 27/026
330/112
2022/0337203 A1* 10/2022 Sharma ............... H03F 3/45475

OTHER PUBLICATIONS

Lizon et al., "Fundamentals of Precision ADC Noise Analysis," Texas Instruments e-book, ti.com/precisionADC, Sep. 2020, 67 pages.

Siddiqui, "Voltage to Time Converter based ADC," Department of Electronics and Nanoengineering Aalto University, School of Electrical Engineering, Apr. 29, 2020, 37 pages.

* cited by examiner

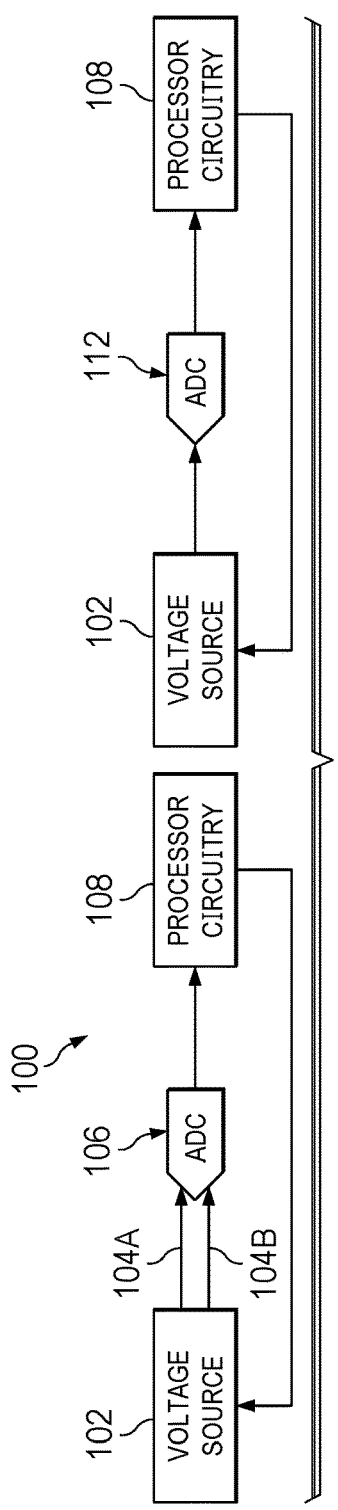
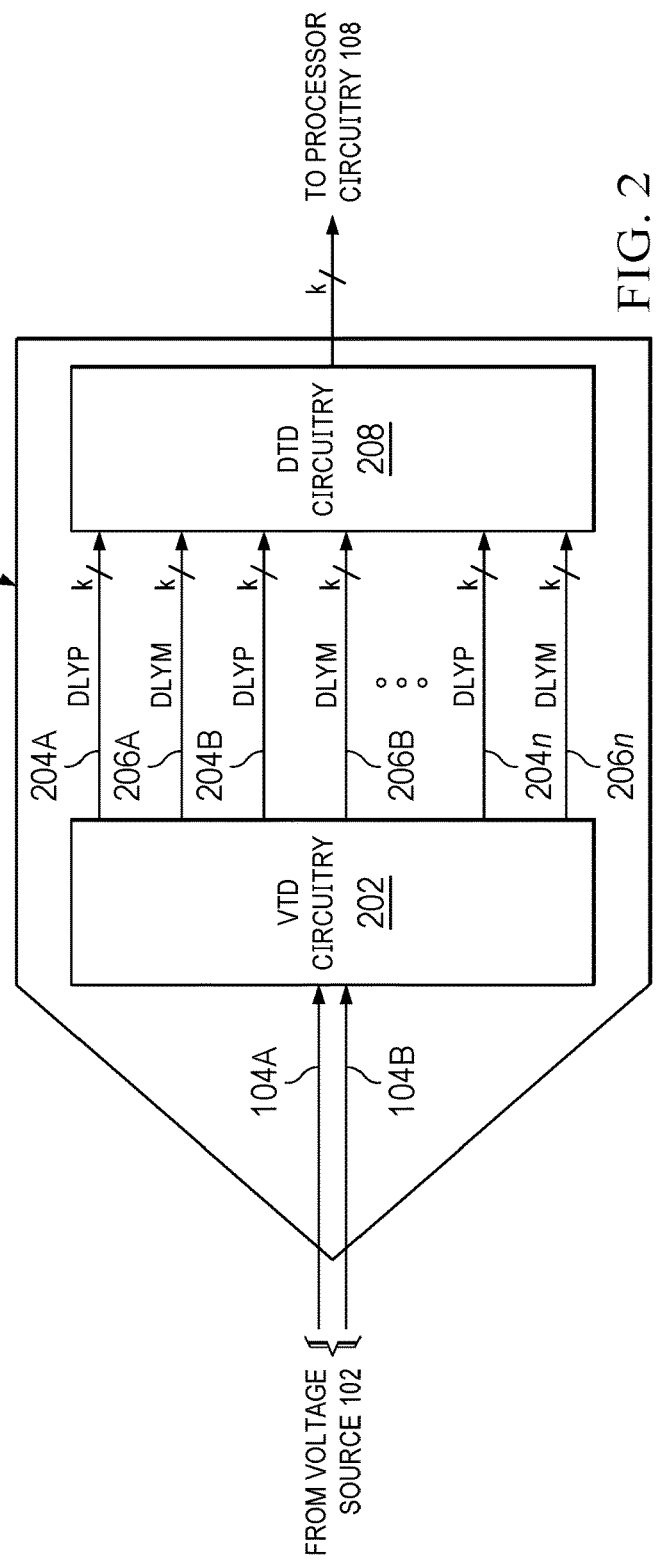
FIG. 1
FIG. 2

METHODS AND APPARATUS TO CONVERT ANALOG VOLTAGES TO DELAY SIGNALS

TECHNICAL FIELD

This description relates generally to analog to digital converter (ADC) circuitry, and more particularly to methods and apparatus to analog voltages to delay information.

BACKGROUND

Information may be represented in computing devices as either a digital or analog signal. In many applications, information requires conversion from an analog signal to a digital signal. For example, an analog voltage may be received over a transmission medium. The analog voltage may be transformed into a digital value. The digital voltage may be stored in a memory circuit, interpreted by processor circuitry, etc.

ADC circuits perform the conversion of analog values to digital voltages and are used in a variety of computing devices. In some examples, the analog to digital conversion can degrade the quality of the signal, causing information to be lost or distorted. Therefore, signal integrity may be used as a performance metric of an ADC circuit.

SUMMARY

For methods and apparatus to convert analog voltages to delay signals, example voltage to delay circuitry includes a first transistor configured to receive an analog voltage signal; a second transistor configured to receive a first control signal, coupled to the first transistor, and coupled to a first terminal; a third transistor configured to receive a second control signal, receive a supply voltage, and coupled to the first terminal; a capacitor coupled to the first terminal and to ground; a fourth transistor configured to receive a third control signal and coupled to the first terminal; a fifth transistor gate configured to receive a bias voltage, coupled to ground, and coupled to the fourth transistor; a sixth transistor coupled to the fourth transistor and to ground; a seventh transistor configured to receive the supply voltage, coupled to the first terminal and to the sixth transistor; and an eighth transistor coupled to the first terminal, to the sixth transistor, and to ground.

BRIEF DESCRIPTION OF THE DRAWINGS

FIG. 1 is a block diagram of an example implementation of a compute environment.

FIG. 2 is a block diagram of an example implementation of the ADC circuitry of FIG. 1.

The same reference numbers or other reference designators are used in the drawings to designate the same or similar (functionally and/or structurally) features.

DETAILED DESCRIPTION

Figure 3:
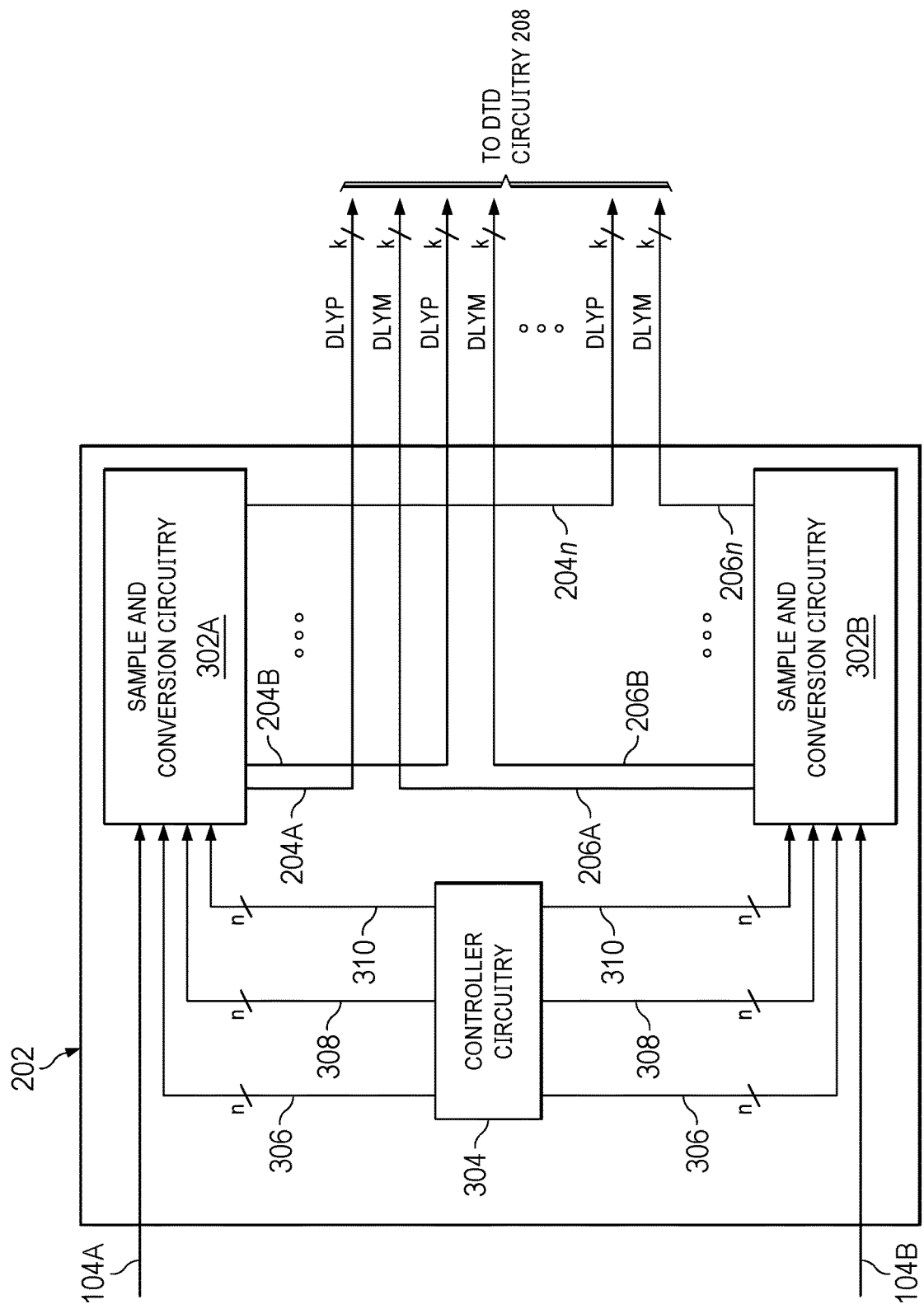
FIG. 3 is a block diagram of an example implementation of the voltage to digital (VTD) circuitry of FIG. 2.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

A wide variety of architectures are used throughout industry to implement ADC circuits. Designers or manufacturers of an electronic device may choose an ADC based on factors that include but are not limited to: cost of implementation, the size, speed, precision, and/or accuracy of the ADC circuit, system-level requirements of the electronic device, etc. One category of ADC architectures are time based ADCs. In one such architecture, a time based ADC may include a voltage to delay (VTD) converter and a delay to digital (DTD) converter. In some examples, a voltage to delay converter is referred to as a voltage to time converter (VTC), and a delay to digital converter is referred to as a time to digital converter (TDC).

In general, a VTD converter operates by converting an analog input voltage signal into a delay signal that is proportional to the input voltage. The DTD converter then converts the delay signal into digital data based on the proportionality. VTD converters and DTD converters are discussed further in connection with FIG. 2.

VTD converters found in industry are typically implemented by one of two architectures. One such architecture is a current starved inverter. A current starved inverter may include a traditional CMOS inverter and additional transistors that are configured to "starve" (i.e., limit) a driving branch of the inverter when the output of the inverter transitions from a high supply voltage (i.e., a logical '1') to a low supply voltage (i.e., a logical '0'). As a result, the amount of time required for a current starved inverter to fall from a high supply voltage to low supply voltage (e.g., the fall time) is proportional to value of the analog input voltage signal. Current starved inverter architectures are frequently used because they enable high bandwidth conversion. However, the sampling instance in current starved inverters is strongly modulated by the original input signal, which results in a nonlinear response and a poor spurious free dynamic range (SDFR). Furthermore, longer fall times in current starved inverters lead to additional noise from VTD converters and further decreases the overall signal to noise ratio (SNR) in time based ADCs.

Another commonly used VTD architecture is a ramp and comparator circuit. A ramp and comparator circuit charges a capacitor using a predetermined ramp signal and compares the ramp with the sampled and held analog input signal, producing an output when the capacitor voltage crosses a threshold voltage determined by the sampled and held analog input signal. To do so, ramp and comparator circuits must include a reset phase in between samples of the input signal. In some examples, a ramp and comparator circuit is preceded by a sample and hold circuit. The reset phase takes up time that would otherwise be used for additional samples and conversions. Without a reset phase, bandwidth of sample and hold circuits are limited by past signal memory. Furthermore, the delay signal generate by ramp and comparator circuits is not large enough for high speed operations due to a lack of time caused by the reset phase. As a result, ramp and comparator circuits suffer from a nonlinear response and can lower the SNR of an ADC.

In some applications, the SNR of a time based ADC can be improved through noise scaling. While various noise scaling architectures exist, any technique to improve SNR will also introduce additional input capacitance to the ADC. The frequency response of such an input resistance (e.g., input resistance from a matching network) and input capacitance, in turn, may limit the bandwidth. As a result, previous solutions to implement VTD circuits result are limited in overall quality due to a trade-off between SNR and bandwidth (i.e., one metric cannot be increased without decreasing the other).

Example methods, apparatus, and systems disclosed herein describe a new VTD circuit architecture. The example VTD circuitry includes an integrator to sample the input voltage and an inverter to produce the corresponding output delay signal. Advantageously, the example inverter is configured such that the output delay signal does not transition between a high supply voltage and a low supply voltage until the period in which the integrator samples the input signal is complete. As a result, the example VTD circuitry does not modulate the sampling instance based on the input signal.

Additionally, examples disclosed herein describe example VTD circuitry with multiple instances of a duplicated architecture, where each instance of the duplicated architecture: a) includes one integrator and one inverter as described above, and b) samples the input voltage signal to produce an output delay signal. Advantageously, the small period of time required for the integrator to sample the input signal enables current sharing amongst each instance of the duplicated architecture in the circuit, resulting in the example VTD circuitry taking multiple samples of the analog input signal during a single window of time. The additional samples from the multiple instances of the duplicated architecture further increase the sample rate above the Nyquist frequency, resulting in the example VTD circuitry achieving a higher SNR than previous solutions.

FIG. 1 is a block diagram of an example implementation of a compute environment. The example compute environment 100 includes an example voltage source 102, example input signals 104A, 104B, example ADC circuitry 106, and example processor circuitry 108, example ADC circuitry 112.

The example voltage source 102 generates the input signals 104A, 104B. The example voltage source 102 may be implemented as any type of device and may generate the input signals 104A, 104B for any purpose. For example, the voltage source 102 may be sensor circuitry that generates the input signals 104A, 104B to perform a measurement. In another example, the voltage source 102 is transceiver circuitry that generates the input signals 104A, 104B in response to receiving data over a transmission medium (e.g., a cell network, a cable, etc.). In some examples, the input signals 104A, 104B change over time.

The example input signals 104A, 104B are analog voltage signals that collectively contain information conveyed by the example voltage source 102. In particular, the example input signals 104A is a positive portion of a differential signal, and the example input signal 104B negative portion of the differential signal. In examples described herein, the voltage source 102 generates the example input signals 104A, 104B rather than a single-ended signal so that the embedded information is less susceptible to noise during transmission. In other examples, the voltage source 102 generates a single-ended signal having one output instead of a differential signal having two outputs. In such examples, the single-ended signal is interpretable by the example ADC circuitry 112.

The example ADC circuitry 106 converts the example input signals 104A, 104B into digital values (i.e., '0' and '1' bits) representative of the information in the analog voltages. In particular, the output of the ADC circuitry 106 is a digital signal which includes a high supply voltage for a logical '1' bit and a low supply voltage for a logical '0' bit. The example ADC circuitry 106 is discussed further in connection with FIG. 2.

The example processor circuitry 108 obtains the digital bits from the ADC circuitry 106 and may perform operations based on the digital bits. For example, the digital bits may represent sensor readings, and the processor circuitry 108 may perform operations by presenting the readings to a user on a display. The example processor circuitry 108 may be implemented by any type of processor device. Examples of processor devices include programmable microprocessors, Field Programmable Gate Arrays (FPGAs) that may instantiate instructions, Central Processor Units (CPUs), Graphics Processor Units (GPUs), Digital Signal Processors (DSPs), or microcontrollers and integrated circuits such as Application Specific Integrated Circuits (ASICs).

In another example, the digital bits represent a message from the voltage source 102, and the processor circuitry 108 performs operations by sending a reply message to the voltage source 102. For instance, suppose the voltage source 102 is a portable speaker, the ADC circuitry 106 and processor circuitry 108 are implemented in a mobile phone, the example input signals 104A, 104B include a pairing message from the portable speaker, and that the mobile phone uses a Bluetooth® protocol to receive the input signals 104A, 104B over a wireless transmission medium. In such an example, the processor circuitry 108 may receive the pairing message from the portable speaker and transmit a Bluetooth® compatible handshake message over the wireless medium in response, thereby beginning the process that pairs the portable speaker to the phone.

It should be noted that, to facilitate the transmission of the input signals 104A, 104B, the encoding of the input signals to digital bits, and the performance of operations based on the digital bits, the example compute environment 100 may include additional elements not illustrated in FIG. 1. These additional elements may include, but are not limited to, power supplies, memory circuitry, interface circuitry, etc.

FIG. 2 is a block diagram of an example implementation of the ADC circuitry 106 of FIG. 1. The example ADC circuitry 106 includes example VTD circuitry 202, example delay positive (DLYP) signals 204A, 204B, . . . 204n, example delay minus (DLYM) signals 206A, 206B, . . . , 206n, and example DTD circuitry 208.

The example VTD circuitry 202 obtains the example input signals 104A, 104B from the example voltage source 102 and outputs delay signals according to the teachings of this disclosure. The example VTD circuitry 202 produces n signals (e.g., the DLYP signals 204A, 204B, . . . 204n) based on the positive portion of the differential signal (e.g., input signal 104A). The example VTD circuitry 202 produces an additional n signals (e.g., the DLYM signals 206A, 206B, . . . 206n) based on the negative portion of the differential signal (e.g., input signal 104B). As used herein, the variable n refers to the number of instances of the duplicated architecture within the example VTD circuitry 202. The duplicated architecture of the example VTD circuitry 202 is discussed further in connection with FIGS. 4 and 5.

The example DTD circuitry 208 obtains the delay signals generated by the example VTD circuitry 202 and converts the delay signals into digital bits. The example DTD circuitry 208 determines the value of the digital bits based on a comparison of two corresponding delay signals (e.g., DLYP signal 204A and DLYM signal 206A). The comparison of two corresponding delay signals is discussed further in connection with FIG. 7.

The example VTD circuitry 202 produces delay signals that, when interpreted by the DTD circuitry 208, produce k bits of information within a given sample of the input signals 104A, 104B. Because the DLYP signals 204A, 204B, . . . 204n and the DLYM signals 206A, 206B, . . . 206n are differential signals, a pair of two corresponding delay signals collectively contains k bits of information in each sample. In some examples, the k bits corresponding to a sample are referred to as a symbol. A given instance of the duplicated architecture in the example VTD circuitry 202 can produce symbols at a certain rate (e.g., 8 giga symbols per second (GSPS)). Furthermore, because there are n instances of the duplicated architecture in the example VTD circuitry 202, the example VTD circuitry 202 transmits k bits information at a rate that is n times larger than the rate of an individual instance. For instance, if a given instance of the duplicated architecture produces k-bit wide symbols at 8 GSPS and n=4, the overall transmission rate from the VTD circuitry 202 to the DTD circuitry 208 is 32 GSPS at k bits per symbol. The example DTD circuitry 208 then can use digital filtering techniques to down sample such that the rate of digital bits provided to the processor circuitry matches the original data rate in the input signals 104A, 104B (e.g., 8 GSPS at k bits per symbol). Advantageously, the duplicated architecture of the example VTD circuitry 202 enables the DTD circuitry 208 to filter and down sample the incoming delay signals, which improves the SNR of the ADC circuitry 106.

FIG. 3 is a block diagram of an example implementation of the VTD circuitry 202 of FIG. 2. The example VTD circuitry 202 includes example sample and conversion circuitry 302A, 302B, example controller circuitry 304, example sample signals 306A, 306B, . . . , 306n (shown collectively in FIG. 3 as sample signals 306), example time amplification (TA) signals 308A, 308B, . . . , 308n (shown collectively in FIG. 3 as TA signals 308), and example reset signals 310A, 310B, . . . , 310n (shown collectively in FIG. 3 as reset signals 310).

The example sample and conversion circuitry 302A obtains the input signal 104A and generates the example DLYP signals 204A, 204B, . . . , 204n based on the positive portion of the differential input signal. To produce the example DLYP signals 204A, 204B, . . . , 204n, the example sample and conversion circuitry 302A includes n instances of the duplicated architecture that perform operations based on the controller circuitry 304. In particular, a given instance of the duplicated architecture obtains one sample signal (e.g., example sample signal 306A), one TA signal (e.g., example TA signal 308A), and one reset signal (e.g., example reset signal 310A).

Similarly, the example sample and conversion circuitry 302B obtains the input signal 104B and generates the example DLYM signals 206A, 206B, . . . , 206n based on the negative portion of the differential input signal. The example sample and conversion circuitry 302B is a mirrored version of the sample and conversion circuitry 302A in the sense that the example sample and conversion circuitry 302B also includes n instances of the duplicated architecture that perform operations based on the controller circuitry 304. In particular, a given instance of the duplicated architecture obtains one sample signal (e.g., example sample signal 306A), one TA signal (e.g., example TA signal 308A), and one reset signal (e.g., example reset signal 310A). In some examples, the sample and conversion circuitry 302A is referred to as a first half circuit and the sample and conversion circuitry 302B is referred to as a second half circuit.

The example controller circuitry 304 generates the example sample signals 306, the example TA signals 308, and the example reset signals 310. The example controller circuitry 304 also provides the foregoing signals to both the signal and conversion circuitry 302A and the signal and conversion circuitry 302B. In doing so, the example controller circuitry 304 coordinates the timing in which the n instances of the duplicated architectures sample the input signals 104A, 104B, discharge a node within the duplicated architecture, and produce a pulse (e.g., a transition from a low supply voltage to a high supply voltage, followed by another transition back to the low supply voltage) in the output delay signal. The example sample signals 306, the example TA signals 308, and the example reset signals 310 are discussed further in connection with FIG. 4.

In some examples, the example controller circuitry 304 can be configured to generate the example sample signals 306, the example TA signals 308, and the example reset signals 310 in a manner that results in a specific performance profile. the example controller circuitry 304 may be configured for any reason, including but not limited to cost, speed, accuracy, precision, system-level requirements of devices within the compute environment 100, etc. The example controller circuitry 304 may be implemented by devices that include but are not limited to one or more integrated circuits, logic circuits, FPGAs, ASICs, etc.

Figure 4:
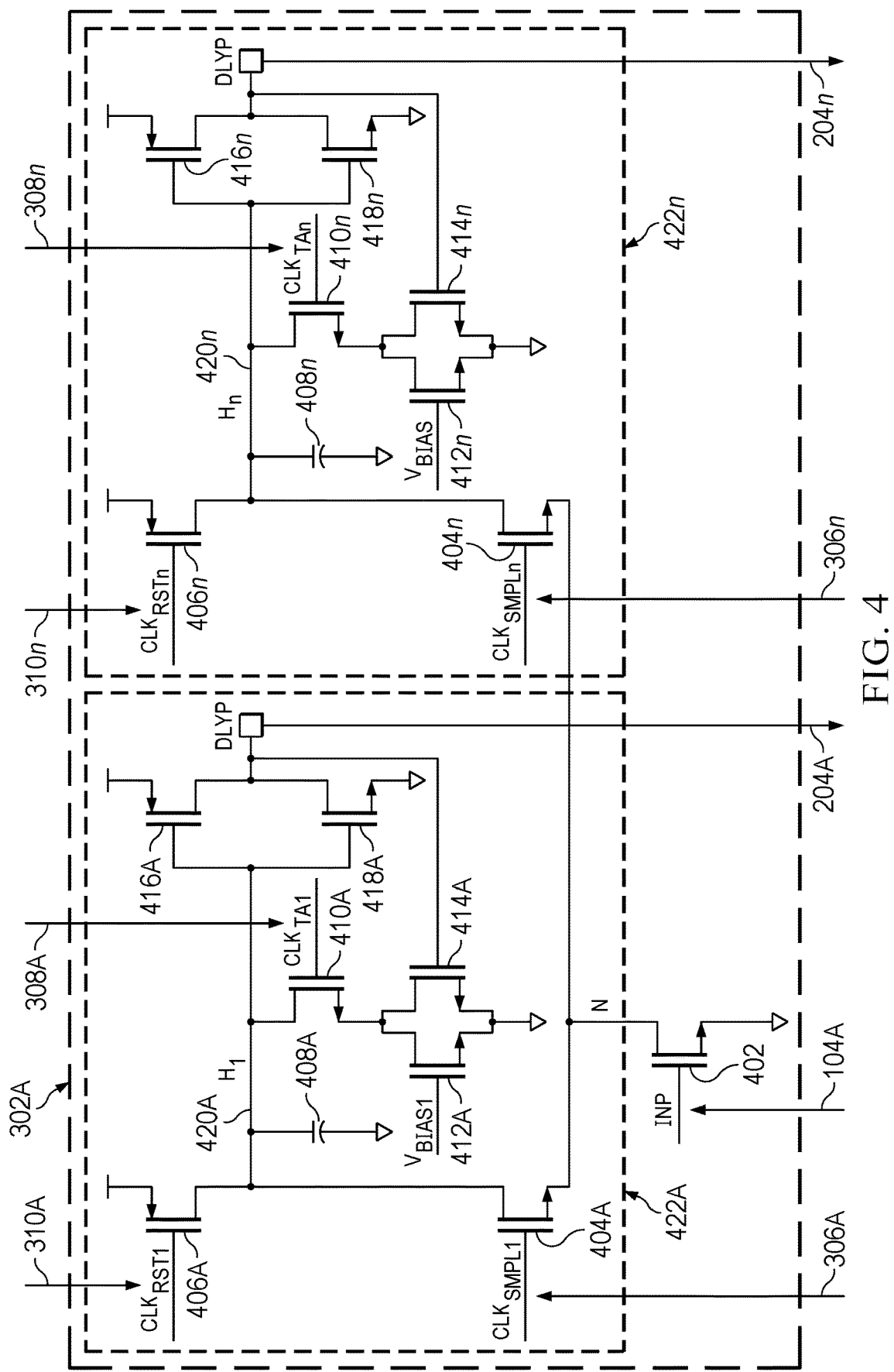
FIG. 4 is a schematic diagram of a first example implementation of the sample and conversion circuitry of FIG. 3.

FIG. 4 is a schematic diagram of a first example implementation of the sample and conversion circuitry 302A of FIG. 3. FIG. 4 includes an example first transistor 402, example second transistors 404A, 404B, . . . , 404n, example third transistors 406A, 406B, . . . , 406n, example first capacitors 408A, 408B, . . . , 408n, example fourth transistors 410A, 410B, . . . , 410n, example fifth transistors 412A, 412B, . . . , 412n, example sixth transistors 414A, 414B, . . . , 414n, example seventh transistors 416A, 416B, . . . , 416n, example eighth transistors 418A, 418B, . . . , 418n, example nodes 420A, 420B, . . . , 420n, and example duplicated architecture instances 422A, 422B, . . . , 422n. A given instance of the duplicated architecture (e.g., 422A) includes one instance of the second transistor (e.g., 404A), one instance of the third transistor (e.g., 406A), one instance of the first capacitor (e.g., 408A), one instance of the fourth transistor (e.g., 410A), one instance of the fifth transistor (e.g., 412A), one instance of the sixth transistor (e.g., 414A), one instance of the seventh transistor (e.g., 416A), and one instance of the eighth transistor (e.g., 418A).

The example first transistor 402 has a first gate that is configured to receive the input signal 104A, a first source that is coupled to ground, and a first drain. In some examples, the first transistor 402 is a n-channel metal oxide semiconductor (NMOS) transistor. In other examples, the first transistor 402 is implemented using a different transistor architecture.

Within the duplicated architecture instance 422A, the example second transistor 404A has a second gate that is configured to receive the sample signal 306A from the example controller circuitry 304, a second source that is coupled to the first drain of the example first transistor 402, and a second drain. In some examples, the second transistor 404A is a NMOS transistor. In other examples, the second transistor 404A is implemented using a different transistor architecture.

Within the duplicated architecture instance 422A, the example third transistor 406A has a third gate that is configured to receive the sample reset signal 310A from the example controller circuitry 304, a third source that is configured to receive a supply voltage, and a third drain that is coupled to the second drain in the second transistor 404A. In particular, the third drain is coupled to the second drain of the second transistor through the node 420A. The supply voltage may be any voltage used to represent a logical '1' in the DLYP signals 204A, 204B, . . . , 204n. In some examples, the supply voltage is provided by a device in the example compute environment 100 such as a power supply. In some examples, the third transistor 406A is an p-channel metal-oxide semiconductor (PMOS) transistor. In other examples, the third transistor 406A is implemented using a different transistor architecture.

Within the duplicated architecture instance 422A, the example first capacitor 408A has a positive terminal coupled to the node 420A and a negative terminal coupled to ground. The example first capacitor 408A may be implemented with any capacitance. In some examples, the example first capacitor 408A may be implemented with a given capacitance based on factors such as cost, size, a desired performance profile of the example ADC circuitry 106, etc.

Within the duplicated architecture instance 422A, the example fourth transistor 410A has a fourth gate that is configured to receive the example TA signal 308A from the example controller circuitry 304, a fourth source, and a fourth drain that is coupled to the example node 420A. In some examples, the fourth transistor 410A is a NMOS transistor. In other examples, the fourth transistor 410 is implemented using a different transistor architecture.

Within the duplicated architecture instance 422A, the example fifth transistor 412A has a fifth gate that is configured to receive a bias voltage, a fifth source that is coupled to ground, and a fifth drain that is coupled to the fourth source of the example fourth transistor 410A. The bias voltage is used to control the gain of the voltage to time conversion operations. In some examples, the bias voltage is provided by a device in the example compute environment 100 such as a power supply. In some examples, the fifth transistor 412A is a NMOS transistor. In other examples, the fifth transistor 412A is implemented using a different transistor architecture.

Within the duplicated architecture instance 422A, the example sixth transistor 414A has a sixth gate, a sixth source that is coupled to ground, and a sixth drain that is coupled to the fourth source of the fourth transistor 410A. In some examples, the sixth transistor 414A is a NMOS transistor. In other examples, the sixth transistor 414A is implemented using a different transistor architecture.

Within the duplicated architecture instance 422A, the example seventh transistor 416A has a seventh gate that is coupled to the example node 420A, a seventh source that is configured to receive the supply voltage, and a seventh drain that is coupled to the sixth gate of the sixth transistor 414A. In some examples, the seventh transistor 416A is an PMOS transistor. In other examples, the seventh transistor 416A is implemented using a different transistor architecture.

Within the duplicated architecture instance 422A, the example eighth transistor 418A has an eighth gate that is coupled to the example node 420A, an eighth source that is coupled to ground, and an eighth drain that is coupled to the to the sixth gate of the sixth transistor 414A. In some examples, the eighth transistor 418A is a NMOS transistor. In other examples, the eighth transistor 418A is implemented using a different transistor architecture.

In the example sample and conversion circuitry 302A of FIG. 4, the first transistor 402, the second transistors 404A, 404B, . . . , 404n, combine with the third transistors 406A, 406B, . . . , 406n to form n sets of integrators. Specifically, a given duplicated architecture instance 422A includes one integrator formed by the first transistor 402, a corresponding second transistor 404A, and a third transistor 406A. The example sample signals 306 include pulses (e.g., a transition from a low supply voltage to a high supply voltage, followed by another transition back to the low supply voltage) that, when received by the n instances of the duplicated architectures, cause the n sets of the integrators to sample the input signal 104A in an interleaved fashion. That is, the example controller circuitry 304 synchronizes the example sample signals 306, the example TA signals 308, and the example reset signals 310 such that a second sample pulse (e.g., a pulse from sample signal 306B, sent to duplicated architecture instance 422B) occurs during the same time that the duplicated architecture instance 422A is converting the input voltage captured during a first sample pulse (from sample signal 306A) into a delay signal. Advantageously, a given pulse from the example sample signals 306 is smaller in time than pulses used to sample a signal in previous VTD architectures. As a result, the example VTD circuitry 202 achieves higher linearity and bandwidth than previous solutions.

In the example sample and conversion circuitry 302A of FIG. 4, the seventh transistors 416A, 416B, . . . , 416n, combine with the eighth transistors 418A, 418B, . . . , 418n to form n sets of inverters, where a given duplicated architecture instance 422A includes one inverter formed by a seventh transistor 416A and an eighth transistor 418A. When the example duplicated architecture instance 422A receives a corresponding sample signal 306A, the integrator samples the input signal 104A, which decreases the voltage exhibited on the node 420A by discharging the capacitor 408A. In some examples, the period of time when the sample signal 306A is at a high supply voltage is referred to as a sample period or an integration period.

After the sample period concludes, the duplicated architecture instance 422A converts the voltage from the capacitor 408A into the example DLYP signal 204A. In particular, the fourth transistor 410A and the fifth transistor 412A begin to discharge the capacitor 408A as soon as the sample period ends (as indicated by the TA signal 308A). After the voltage of the node 420A crosses a threshold, the sixth transistor 414A also participates in discharging, which produces a rising edge of the inverter (i.e., the DLYP signal 204A). In doing so, the duplicated architecture instance 422A begins a reset phase of the example node 420A while simultaneously converting the input signal to a delay signal. As a result, the example VTD circuitry 202 can produce delay signal pulses more frequently, therefore achieving a higher throughput, than previous solutions that have a separate reset phase following a conversion phase. The discharge of the example capacitor 408A is discussed further in connection with FIGS. 7, 8 and 9.

Because the example sample and conversion circuitry 302B is a mirrored version of the sample and conversion circuitry 302A, the sample and conversion circuitry 302B may be implemented using the same electrical components, couplings, and control signals illustrated in FIG. 4. However, the example sample and conversion circuitry 302B samples the input signal 104B to produce DLYM signals 206A, 206B, . . . , 206n, while the example sample and conversion circuitry 302A samples the input signal 104A to produce DLYP signals 204A, 204B, . . . , 204n.

Figure 5:
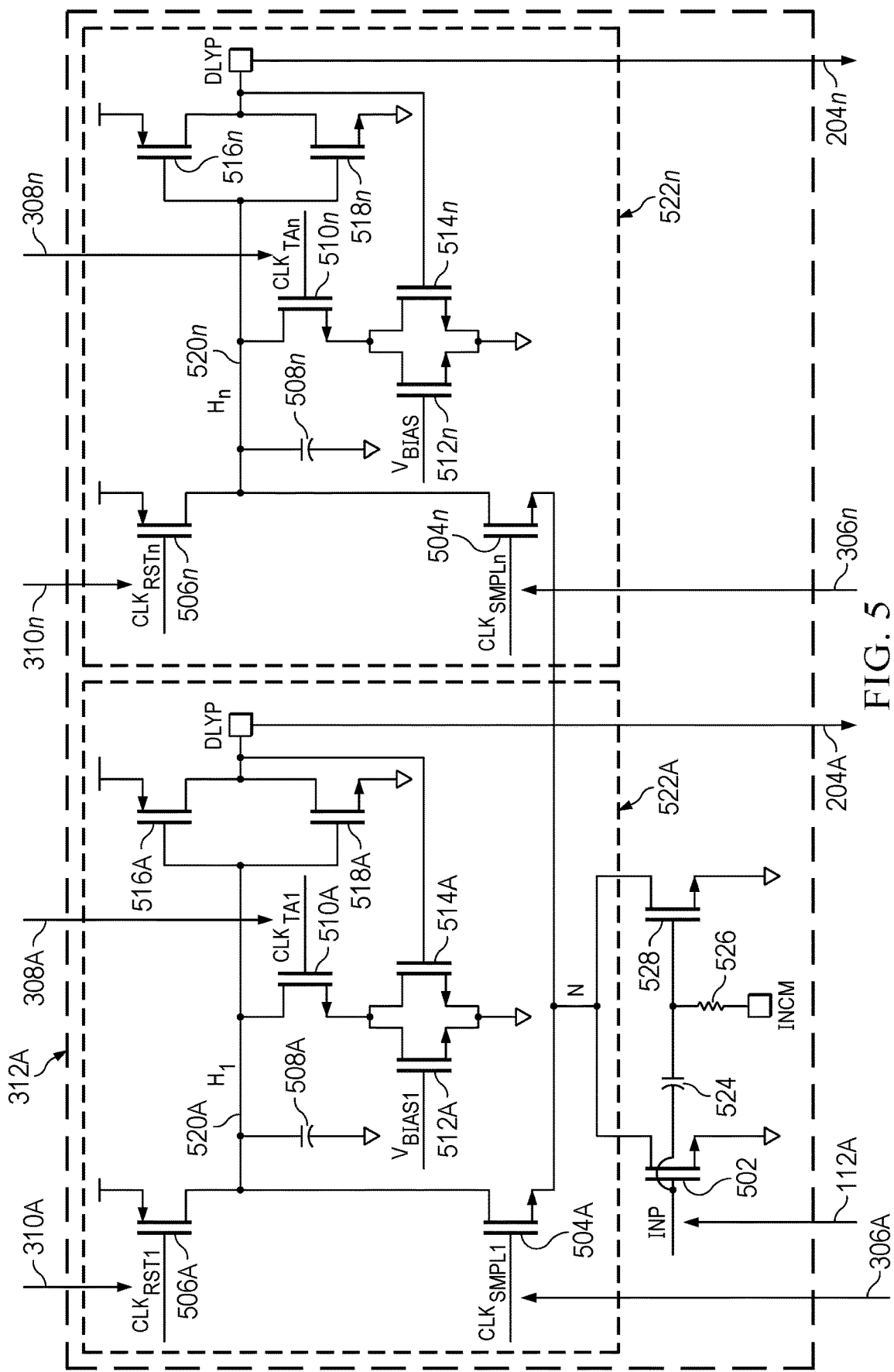
FIG. 5 is a schematic diagram of a second example implementation of the sample and conversion circuitry of FIG. 3.

FIG. 5 is a schematic diagram of a second example implementation of the sample and conversion circuitry of FIG. 3. FIG. 5 includes example sample and conversion circuitry 302A, an example first transistor 502, example second transistors 504A, 504B, . . . , 504n, example third transistors 506A, 506B, . . . , 506n, example first capacitors 508A, 508B, . . . , 508n, example fourth transistors 510A, 510B, . . . , 510n, example fifth transistors 512A, 512B, . . . , 512n, example sixth transistors 514A, 514B, . . . , 514n, example seventh transistors 516A, 516B, . . . , 516n, example eighth transistors 518A, 518B, . . . , 518n, example nodes 520A, 520B, . . . , 520n, and example duplicated architecture instances 522A, 522B, . . . , 522n. In the example block diagram of FIG. 5, the example sample and conversion circuitry 302A also includes an example second capacitor 524, an example resistor 526, and an example ninth transistor 528.

The example sample and conversion circuitry 302A is an alternative implementation of the example sample and conversion circuitry 302A. That is, in some examples, the VTD circuitry 202 of FIG. 2 can be implemented with the sample and conversion circuitry 302A rather than the sample and conversion circuitry 302A. In such examples, the VTD circuitry 202 of FIG. 2 would be implemented with the sample and conversion circuitry 302B (a mirrored version of the circuit diagram illustrated in FIG. 5) rather than the sample and conversion circuitry 302B.

Within the example sample and conversion circuitry 302A, the example second capacitor 524 has a negative terminal coupled to the gate of the example first transistor 502 and a positive terminal. The example resistor 526 has a first terminal coupled to the positive terminal of the second capacitor 524, and a second terminal coupled to an input common mode (INCM) signal. The INCM signal is a biasing signal used by the ninth transistor 528. In some examples, the INCM signal is generated by a device in the compute environment 100 such as a power supply. The example ninth transistor 528 has a ninth gate coupled to the positive terminal of the second capacitor 524, a ninth source coupled to ground, and a ninth drain coupled to the drain of the example first transistor 502.

The example sample and conversion circuitry 302A includes n example duplicated architecture instances 522A, 522B, . . . , 522n that include the same electrical components, include the same control signals, and perform the same functions as the n example duplicated architecture instances 422A, 422B, . . . , 422n of FIG. 4. However, the example sample and conversion circuitry 302A also includes the example second capacitor 524, the example resistor 526, and the example ninth transistor 528, while FIG. 4 does not include corresponding components. In the example sample and conversion circuitry 302A, the foregoing components form a high pass filter that provides a stable SNR across a wide band of sampling frequencies.

Advantageously, the example sample and conversion circuitry 302A enables the example VTD circuitry 202 to provide programmability between SNR and bandwidth metrics. For example, both: (1) the voltage of the INCM signal that is applied to one terminal of the example resistor 526, and (2) the width of the pulses in the example sample signals 306, may be tuned (e.g., select specific values may be selected) together. In some examples, the width of the example sample signals 306 is increased while the voltage of the INCM signal is decreased to achieve higher SNR at the expense of a lower bandwidth. In alternative examples, the voltage of the INCM signal is increased while width of the example sample signals 306 is decreased to achieve a higher bandwidth at the expense of a lower SNR.

Because the example sample and conversion circuitry 302B referenced above is a mirrored version of the sample and conversion circuitry 302A, the sample and conversion circuitry 302B may be implemented using the same electrical components, couplings, and control signals illustrated in FIG. 5. However, the example sample and conversion circuitry 302B samples the input signal 104B to produce DLYM signals 206A, 206B, . . . , 206n, while the example sample and conversion circuitry 302A samples the input signal 104A to produce DLYP signals 204A, 204B, . . . , 204n.

Figure 6:
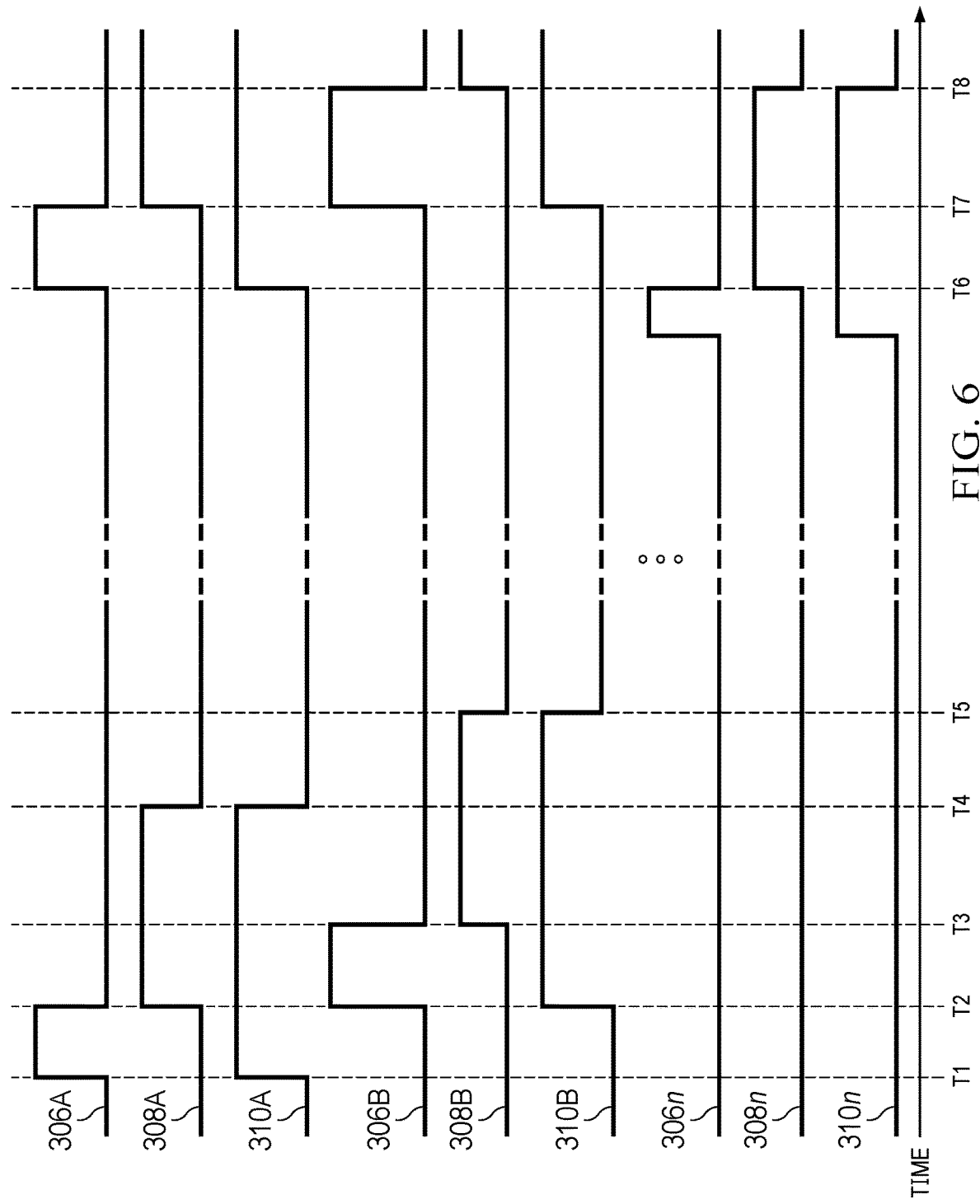
FIG. 6 is an example timing diagram of signals sent by the controller circuitry of FIG. 3.

FIG. 6 is an example timing diagram of signals sent by the controller circuitry of FIG. 3. FIG. 6 displays the example sample signals 306, the example TA signals 308, and the example reset signals 310 on a timeline. The timeline of FIG. 6 is ordered chronologically such that T1 occurs before T2, T2 occurs before T3, etc.

Within a given duplicated architecture instance 422A, a one sample signal (e.g., example sample signal 306A), one TA signal (e.g., example TA signal 308A), and one reset signal (e.g., reset signal 310A) control the sequence of operations. For example, at T1, the controller circuitry 304 transmits the rising edge of a pulse in the sample signal 306A, causing the integrator (formed by the first transistor 402, the second transistor 404A, and the third transistor 406A) to sample the input signal 104A. The example controller circuitry 304 also causes the reset signal 310A to transition from a low supply to a high supply voltage. Because the example reset signals 310 are active low signals, the transition of the reset signal 310A to a high supply voltage prevents reset operations.

The sample/integration period of the example duplicated architecture instance 422A lasts until T2, when the controller circuitry 304 transmits a falling edge of the pulse in the sample signal 306A. The example controller circuitry 304 also causes the TA signal 308A to transition from a low supply voltage to a high supply voltage at T2. The transition in the example TA signal 308A causes the example fourth transistor 410A to turn on, thereby causing the input voltage of the inverter to fall. The rate at which the input voltage of the inverter falls is determined by the fifth transistor 412A and the sixth transistor 414A. As a result, the conversion of the input signal 104A to a delay signal (i.e., the conversion phase), and the discharge of the capacitor 408A (i.e., the reset phase) begin at T2. The conversion continues until T4, when the example controller circuitry 304 transitions the example TA signal 308A back to a low supply voltage. The example controller circuitry 304 also transitions the reset signal 310A back to a low supply voltage at T4, enabling the capacitor to begin recharging for another sample at T4.

Advantageously, the second transistor 404A turns off at T2, enabling the delay conversion and reset phases of the duplicated architecture instances 422A to occur independently from the operations of the duplicated architecture instances 422B, . . . , 422n. For example, the example controller circuitry sends a pulse in the sample signal 306B from T2 to T3, causing the duplicated architecture instance 422B to sample the signal while the duplicated architecture is in the conversion phase. Advantageously, because the time between T1 and T2, and the time between T2 and T3 (e.g., the width of a sample pulse) is shorter than sample periods previous solutions, the example VTD circuitry 202 can support n instances of the duplicated architecture, increasing SNR through oversampling.

In general, if x refers to an index of the example sample signals 306, the example controller circuitry 304 may transmit a rising edge of a pulse in the (x+1)th sample signal any amount of time after transmitting a falling edge of the pulse in the xth sample signal. After transmitting the falling edge of the sample signal 306n, each of the n duplicated architecture instances have sampled the same k bits of information present in the input signal. As a result, the example controller circuitry 304 may transmit a rising edge in the sample signal 306A, beginning a sample of the next k bits of information from the duplicated architecture instance 422A, as soon as: (1) the falling edge of the of the sample signal 306n has been transmitted and (2) the reset phase of the duplicated architecture instance 422A is complete. The sample, conversion, and reset phases are discussed further in connection with FIG. 7.

Figure 7:
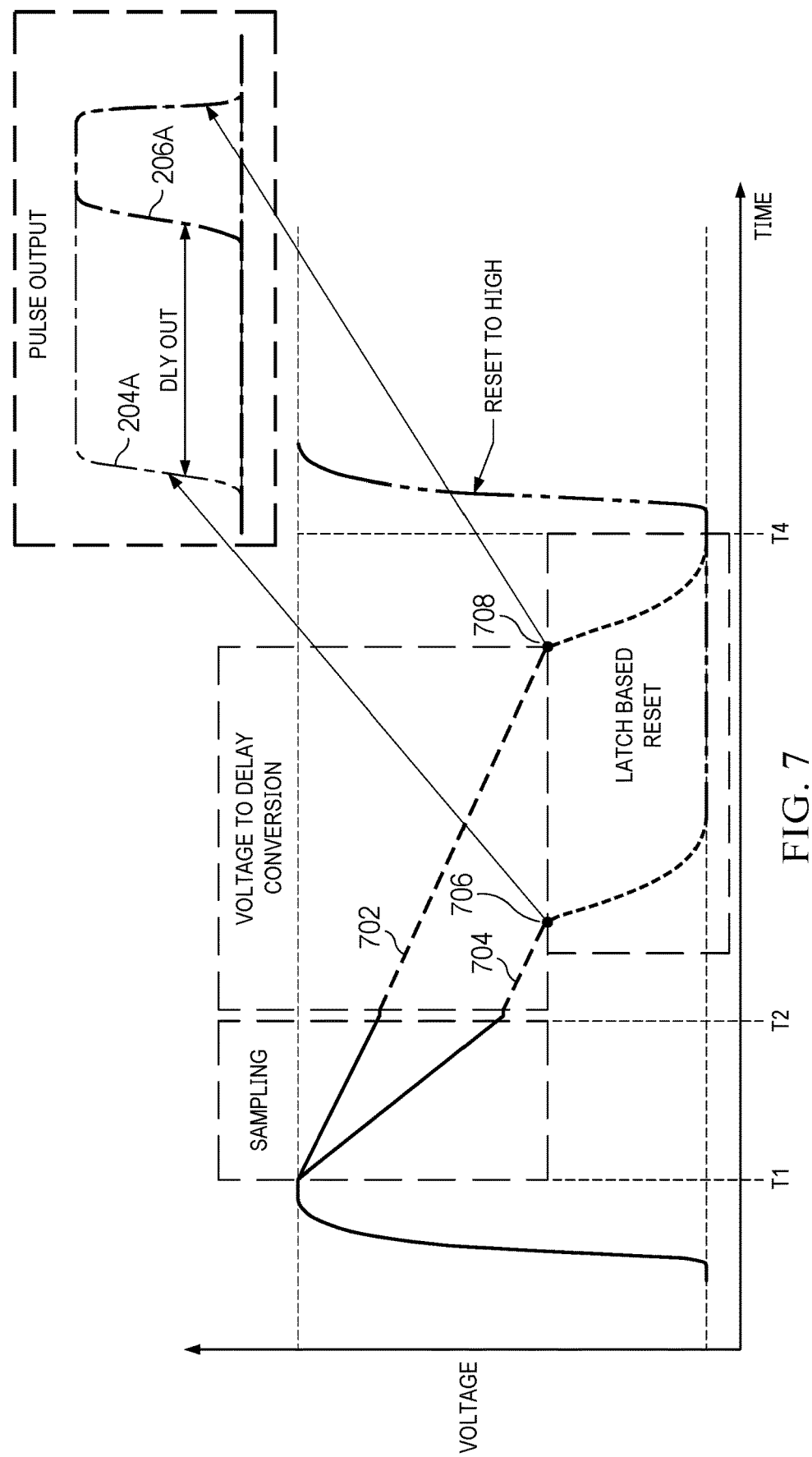
FIG. 7 is an illustrative example of a first delay signal and a second delay signal provided by the signal and conversion circuitry of FIG. 3.

FIG. 7 is an illustrative example of a first delay signal and a second delay signal provided by the signal and conversion circuitry of FIG. 3. In particular, FIG. 7 includes the DLYP signal 204A produced by the sample and conversion circuitry 302A and the DLYM signal 206A produced by the sample and conversion circuitry 302B. FIG. 7 also includes example signals 702, 704, and the example points 706, 708.

The example signal 702 refers to the voltage of the example node 420A from the sample and conversion circuitry 302A. As a result, the timing of changes in the example signal 702 affect the value of the DLYP signal 204A. Similarly, the example signal 704 refers to the voltage of the example node 420A from the sample and conversion circuitry 302B. As a result, the timing of changes in the example signal 704 affect the value of the DLYM signal 206A. The example signals 702, 704, are overlayed in FIG. 7 for comparison purposes. FIG. 7 also includes timestamps T1, T2, and T4, which refer to the same points in time as T1, T2, and T4 from FIG. 6.

At T1, the example sample and conversion circuitry 302A begins to sample the input signal 104A and the sample and conversion circuitry 302B begins to sample the input signal 104B. Both sampling phases decrease the voltage of their respective node 420A, and both sampling phases end at T2. However, because the input signal 104A is a different voltage than the input signal 104B, the voltages of the nodes decrease at different rates during the sample period. As a result, the voltage in the signal 702 is different from the voltage in the signal 704 at T2.

At T2, the example controller circuitry 304 transmits a rising edge of the TA signal 308A to both the sample and conversion circuitry 302A and the sample and conversion circuitry 302B. As a result, the fifth transistors 412A and sixth transistors 414A begin the conversion of the sampled current to delay signals. Specifically, during the conversion phase (which begins at T2), the example fifth transistors 412A and the example sixth transistors 414A discharge node 420 at the same rate in each instance of the sample and conversion circuitry 302A and 302B.

The discharge of both nodes 420A continue until the voltage of the node 420A satisfies a threshold. In examples described herein, the threshold that ends the conversion phase occurs when the voltage of the node 420A falls below a threshold voltage of the example fourth transistor 410A. Because the example signals 702, 704 were at the different voltage when the discharge at the same rate began (e.g., at T2), the node 420A from the sample and conversion circuitry 302A will satisfy the threshold voltage at a different point in time than the sample and conversion circuitry 302B. For example, the signal 702 (corresponding to the sample and conversion circuitry 302A) satisfies the threshold at point 708, while the signal 704 satisfies the threshold earlier at point 706. This difference in time (e.g., a delay) between the thresholds of the nodes 420A directly causes the delay to occur between a rising edge of the DLYP signal 204A and a rising edge of the DLM signal 206A. The example VTD circuitry 202 provides the DLYP signal 204A and the DLM signal 206A to the DTD circuitry 208, which uses the difference in time between rising edges to produce k digital bits corresponding to the analog input signals 104A, 104B. The example TA signal 308 is referred to as a time amplification signal because the difference in time between rising edges of the DLYP signal 204A and the DLM signal 206A may be amplified relative to the difference in time between when node 420A of the sample and conversion circuitry 302A satisfies the threshold voltage and when node 420A of the sample and conversion circuitry 302B satisfies the threshold voltage.

The voltage of the node 420A falling below the threshold voltage triggers the inverters (i.e., the seventh transistors 416A and eighth transistors 418A), causing the example capacitor 408 to finish discharging through positive feedback created by the fourth transistor 410A and the sixth transistor 416A. Once the example capacitor 408 has finished discharging, the example controller circuitry 304 transitions the corresponding reset signal 310 from a high supply voltage to a low supply voltage. When the reset signal 310 transitions to a low supply voltage, the third transistor 406A enables the capacitor 408A to recharge via the supply voltage received at the source of the third transistor 406A. Once the capacitor is fully charged, the duplicated architecture instance is ready to sample the input signal again.

FIG. 7 shows how, advantageously, the voltage of node 420A begins to discharge when the conversion period starts. As a result, the duplicated architecture instance 422A can finish discharging node 420A and subsequently recharge the capacitor 408A in less time than previous solutions may be able to do so, resulting in the example VTD circuitry 202 exhibiting improved throughput and bandwidth over the previous solutions.

Figure 8:
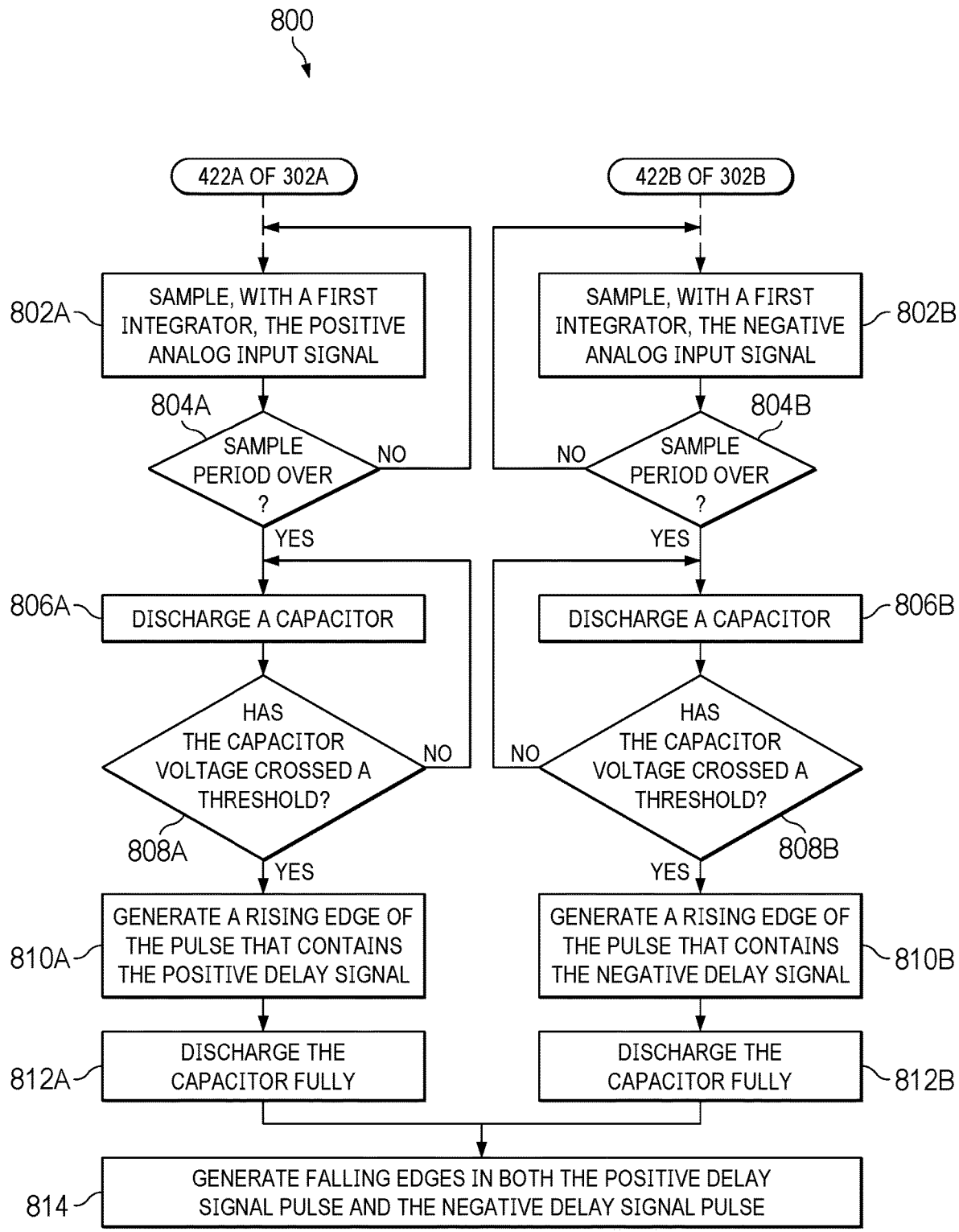
FIG. 8 is a flowchart representative of an example process that may be performed using machine readable instructions that can be executed and/or hardware configured to implement the controller circuitry 304 of FIG. 3, and/or, more generally, the VTD circuitry of FIG. 2 to convert an analog signal to a delay signal corresponding to a first sample.
Figure 9:
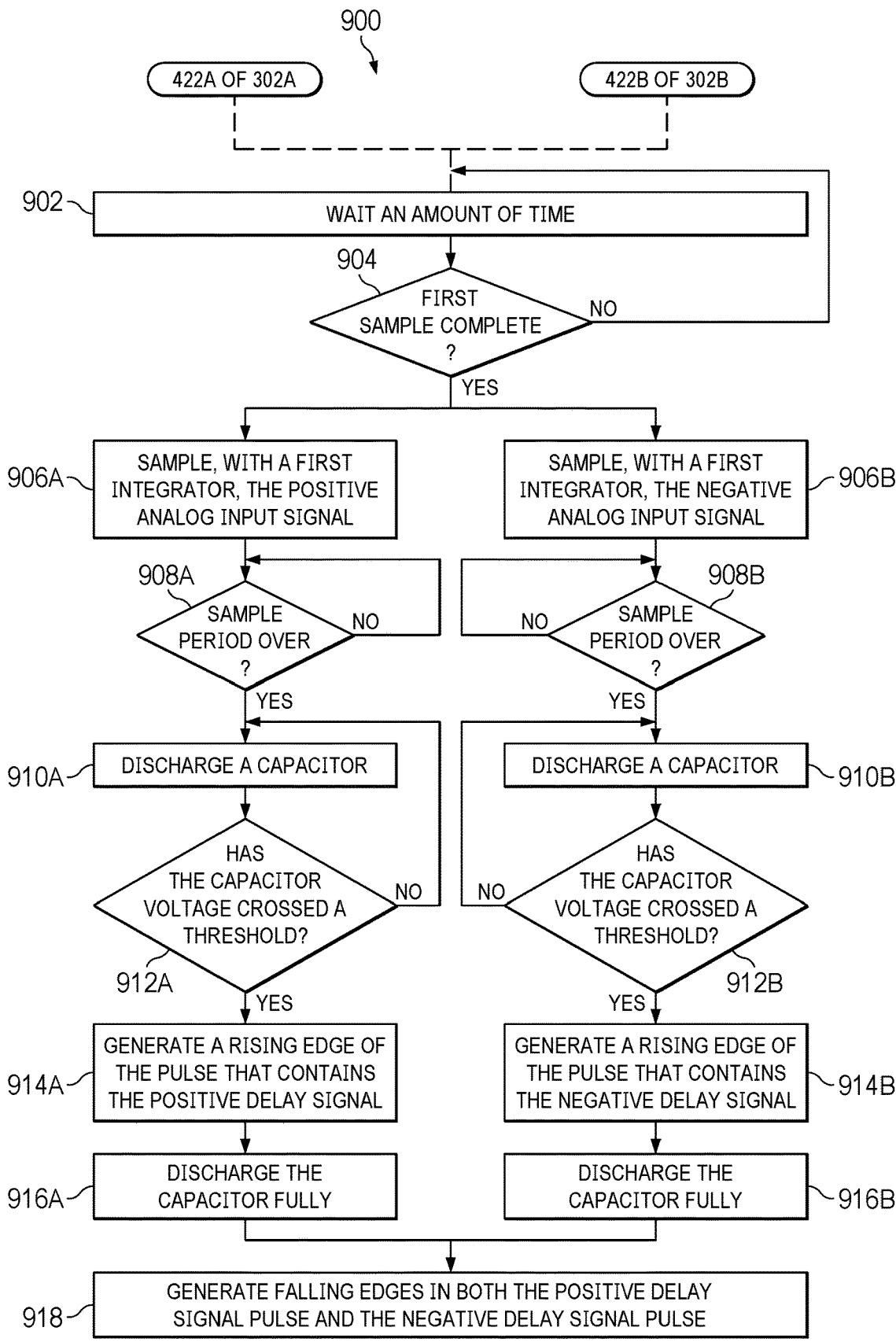
FIG. 9 is a flowchart representative of an example process that may be performed using machine readable instructions that can be executed and/or hardware configured to implement the controller circuitry 304 of FIG. 3, and/or, more generally, the VTD circuitry of FIG. 2 to convert an analog signal to a delay signal corresponding to a second sample.

A flowchart representative of example machine readable instructions, which may be executed to configure processor circuitry to implement the controller circuitry 304 of FIG. 3, is shown in FIGS. 8 and 9. The machine readable instructions may be one or more executable programs or portion(s) of an executable program for execution by processor circuitry, such as the processor circuitry 1012 shown in the example processor platform 1000 discussed below in connection with FIG. 10. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowchart illustrated in FIGS. 8 and 9, many other methods of implementing the example controller circuitry 304 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU, an XPU, etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 8 and 9 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory computer readable storage medium, non-transitory machine readable medium, and non-transitory machine readable storage medium are expressly defined to include any type of computer readable storage device and/or storage disk and to exclude propagating signals and to exclude transmission media. As used herein, the terms "computer readable storage device" and "machine readable storage device" are defined to include any physical (mechanical and/or electrical) structure to store information, but to exclude propagating signals and to exclude transmission media. Examples of computer readable storage devices and machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer readable instructions, machine readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 8 is a flowchart representative of an example process that may be performed using machine readable instructions that can be executed and/or hardware configured to implement the controller circuitry 304 of FIG. 3, and/or, more generally, the VTD circuitry 202 of FIG. 2 to convert an analog signal to a delay signal corresponding to a first sample. The example flowchart of FIG. 8 is divided into two columns such that the blocks in the "422A of 302A" column correspond to signals sent from the controller circuitry 304 to the duplicated architecture instance 422A in the example sample and conversion circuitry 302A. Similarly, blocks within the "422A of 302B" column correspond to signals sent from the controller circuitry 304 to the duplicated architecture instance 422A in example sample and conversion circuitry 302B.

The example machine readable instructions and/or operations 800 begin when the example controller circuitry 304 causes the integrator to sample the positive analog input signal 104A. (Block 802A). To cause the integrator to sample the positive analog input signal 104A, the example controller circuitry 304 transmits a rising edge of a pulse in the sample signal 306A. At the same time as block 802A, the example controller circuitry 304 also transmits the rising edge to the sample and conversion circuitry 302B, causing an integrator to begin sampling the negative analog input signal 104B (Block 802B). The voltages of the nodes 420A decrease at different rates during the sample period.

The example controller circuitry 304 determines whether the sample period of the positive input signal 104A is over. (Block 804A). At the same time, the example controller circuitry determines whether the sample period of the negative input signal 104B is over. (Block 804B). Because the analog input signal 104A and analog input signal 104B are two parts of a differential signal that are interpreted together, the sample period of block 804A is equal to the sample period of block 804B. In some examples, the sample period is configured based on the transmission rate of the voltage source 102.

If the example controller circuitry 304 determines the sample period is not over (Block 804A: No and Block 804B: No), control returns from block 804A to 802A, and from block 804B to 802B, where sampling continues of the input signals 104A, 104B. If the example controller circuitry 304 determines the sample period is over (Block 804A: Yes), the example controller circuitry 304 causes the capacitor 408A from the sample and conversion circuitry 302A to begin discharging (Block 806A). At the end of the sample period (Block 804B: Yes), the example controller circuitry 304 also causes the capacitor 408A from the sample and conversion circuitry 302B to begin discharging (Block 806B).

The example controller circuitry 304 causes both capacitors 408A to begin discharging by transmitting a rising edge of the TA signal 308A to both instances of the sample and conversion circuitry 302A, 302B. During block 806A, the example capacitor 408A in the sample and conversion circuitry 302A discharges at a first rate before the corresponding inverter is triggered and discharges at a second rate after the inverter is triggered. During block 806B, the example capacitor 408A in the sample and conversion circuitry 302B discharges at a same first rate before the corresponding inverter is triggered and discharges at the same second rate after the inverter is triggered.

The example controller circuitry 304 determines whether the voltage of the capacitor 408A from the sample and conversion circuitry 302A has crossed a threshold. (Block 808A). In some examples, the example controller circuitry 304 uses an empirically measured and/or pre-determined discharge rate to determine the voltage of the capacitor 408A. For example, the example controller circuitry 304 may determine the voltage of the capacitor 408A by using the amount of time since the start of the discharge and the discharge rate to determine a total voltage loss. If the voltage of the example capacitor 408A from the sample and conversion circuitry 302A has not crossed the voltage threshold (Block 808A: No), control returns to block 806A, where the capacitor 408A continues to discharge. The threshold of blocks 808A, 808B may be a pre-determined value based on the supply voltage that determines when the inverter is triggered.

Similarly, the example controller circuitry 304 determines whether the voltage of the capacitor 408A from the sample and conversion circuitry 302B has crossed the threshold. (Block 808B). As described above, the example controller circuitry 304 also uses the empirically measured and/or pre-determined discharge rate to determine the voltage of the capacitor 408A. If the voltage of the example capacitor 408A from the sample and conversion circuitry 302B has not crossed the threshold (Block 808B: No), control returns to block 806B, where the capacitor 408A continues to discharge.

After the voltage of the example capacitor 408A from the sample and conversion circuitry 302A has crossed the threshold (Block 808A: Yes), the example controller circuitry 304 generates a rising edge of the pulse in the DLYP signal 204A (Block 810A). The rising edge of the pulse in the DLYP signal 204A is caused by the voltage of the capacitor 408A crossing the threshold of block 808A and triggering the inverter in the sample and conversion circuitry 302A.

Similarly, after the example capacitor 408A from the sample and conversion circuitry 302B has crossed the threshold (Block 808B: Yes), the example controller circuitry 304 generates a rising edge of the pulse in the DLYM signal 206A (Block 810B). The rising edge of the pulse in the DLYM signal 206A is caused by the voltage of the capacitor 408A crossing the threshold of block 808B and triggering the inverter in the sample and conversion circuitry 302B. Because the node 420A in the sample and conversion circuitry 302B discharged at a different rate than the node 420A in the sample and conversion circuitry 302A, the rising edge of the pulse in the DLYM signal 206A occurs at a different point in time than the rising edge of the pulse in the DLYP signal 204A.

The example controller circuitry 304 waits until the sample and conversion circuitry 302A has fully discharged. (Block 812A). The example controller circuitry 304 also waits until the sample and conversion circuitry 302A has fully discharged. (Block 812B). The example controller circuitry 304 may use the pre-determined discharge rate and the operating characteristics of the positive feedback created by the fourth transistor 410A and the sixth transistor 416A to determine an amount of time required for a given capacitor 408A to completely discharge after crossing the threshold.

Once both capacitors have been fully discharged, the example controller circuitry 304 generates a falling edge for both the DLYP signal 204A pulse and the DLYM signal 206A pulse. (Block 814). To generate the falling edges, the example controller circuitry 304 transitions the reset signal 310A to a low voltage in both the sample and conversion circuitry 302A and the sample and conversion circuitry 302B. The transition in the reset signal 310A also enables the capacitors 408A to recharge back to the supply voltage for the next sample.

Because the differential nature of the input signals 104A, 104B causes the mirrored instances of the sample and conversion circuitry 302A, 302B to generate a rising edge of pulses in the DLYP signal 204A and the DLYM signal 206A at different times, the controller circuitry 304 causes the falling edges of the DLYP signal 204A and the DLYM signal 206A to occur at the same time (Block 814). As a result, the width of the pulse (i.e., the amount of time a high supply voltage is exhibited) in the DLYP signal 204A is different from the width of the pulse in the DLYM signal 206A. This difference in rising edges of the two pulses enables the DTD circuitry 208 to generate digital bits corresponding to the input signals 104A, 104B. Furthermore, the similar falling edges of the two pulses ensure that both the sample and conversion circuitry 302A and the sample and conversion circuitry 302B have equal reset time for the circuitry in the DTD circuitry 208.

FIG. 9 is a flowchart representative of an example process that may be performed using machine readable instructions that can be executed and/or hardware configured to implement the controller circuitry 304 of FIG. 3, and/or, more generally, the VTD circuitry 202 of FIG. 2 to convert an analog signal to a delay signal corresponding to a second sample. The example flowchart of FIG. 9 is divided into two columns such that the blocks in the "422B of 302A" column correspond to signals sent from the controller circuitry 304 to the duplicated architecture instance 422B in the example sample and conversion circuitry 302A. Similarly, blocks within the "422B of 302B" column correspond to signals sent from the controller circuitry 304 to the duplicated architecture instance 422B in example sample and conversion circuitry 302B.

The example machine readable instructions and/or operations 900 begin when the example controller circuitry 304 waits an amount of time. (Block 902). During the wait period of block 902, the first duplicated architecture instances 422A of the sample and conversion circuitry 302A, 302B sample the input signal 104A, 104B a first time (Block 802A and Block 802B). After an amount of time, the example controller circuitry 304 determines whether the first sample is complete (Block 904). If the first sample is not complete (Block 904: No), control returns to block 902, where the example controller circuitry 304 continues to wait.

If the example controller circuitry 304 determines the first sample is complete (Block 904: Yes), the example controller circuitry 304 causes the duplicated architecture instance 422B of the sample and conversion circuitry 302A to sample the positive analog input signal 104A. (Block 906A). After completion of the first sample (Block 904: Yes), the example controller circuitry 304 also causes the duplicated architecture instance 422B of the sample and conversion circuitry 302B to sample the negative analog input signal 104B. (Block 906B). To cause the duplicated architecture instances 422B to sample the analog input signals 104A, 104B, the example controller circuitry 304 transmits a rising edge of a pulse in the sample signal 306B to both instances of the sample and conversion circuitry 302A, 302B.

When implementing blocks 906A, 906B, 908A, 908B, 910A, 910B, 912A, 912B, 914A, 914B, 916A, 916B, and 918 of FIG. 9, the example controller circuitry 304 mirrors the operations of blocks 802A, 802B, 804A, 804B, 806A, 806B, 808A, 808B, 810A, 810B, 812A, 812B, and 814 of FIG. 8, respectively. However, while the flowchart of FIG. 8 describe example signals sent from the controller circuitry 304 that cause the duplicated architecture instances 422A to produce pulses in the DLYP signal 204A and DLYM signal 206A, the flowchart of FIG. 9 describes example signals from the controller circuitry 304 that cause the duplicated architecture instances 422B to produce pulses in the DLYP signal 204B and DLYM signal 206B.

Notably, the execution of blocks 906A, 906B, 908A, 908B, 910A, 910B, 912A, 912B, 914A, 914B, 916A, 916B, and 918 of FIG. 9 are shifted in time relative to the execution of 802A, 802B, 804A, 804B, 806A, 806B, 808A, 808B, 810A, 810B, 812A, 812B, and 814. In particular, the example controller circuitry 304 coordinates pulses in the example sample signals 306A, 306B such that execution of blocks 906A, 906B do not begin until execution of blocks 802A, 802B begin. As a result, the example duplicated architecture instance 422*n* does not sample the input signal until all duplicated architecture instances 422A, 422B, . . . 422(*n*−1) have sampled the input signal, and the duplicated architecture instance 422A does not sample the input signal a second time until all n duplicated architecture instances 422 have sampled the input signal a first time (as shown in FIG. 6).

Figure 10:
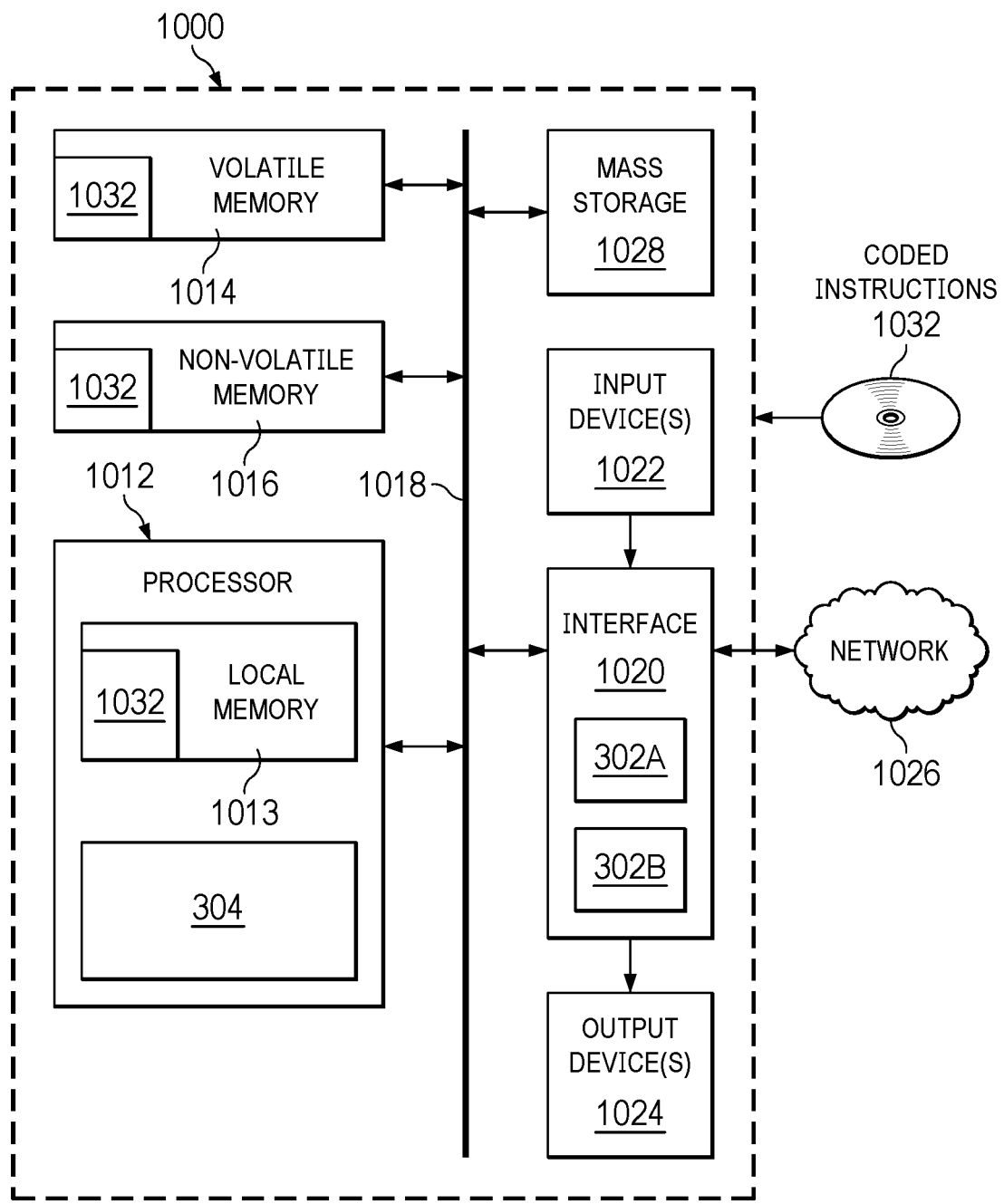
FIG. 10 is a block diagram of an example processing platform including processor circuitry structured to execute the example machine readable instructions and/or the example operations of FIGS. 8 and 9 to implement the controller circuitry of FIG. 3.

FIG. 10 is a block diagram of an example processor platform 1000 structured to execute and/or instantiate the machine readable instructions and/or the operations of FIGS. 8 and 9 to implement the VTD circuitry 202 of FIG. 2. The processor platform 1000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 1000 of the illustrated example includes processor circuitry 1012. The processor circuitry 1012 of the illustrated example is hardware. For example, the processor circuitry 1012 can be implemented by one or more integrated circuits, logic circuits, FPGAs, microprocessors, CPUs, GPUs, DSPs, and/or microcontrollers from any desired family or manufacturer. The processor circuitry 1012 may be implemented by one or more semiconductor based (e.g., silicon based) devices. In this example, the processor circuitry 1012 implements the controller circuitry 304.

The processor circuitry 1012 of the illustrated example includes a local memory 1013 (e.g., a cache, registers, etc.). The processor circuitry 1012 of the illustrated example is in communication with a main memory including a volatile memory 1014 and a non-volatile memory 1016 by a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1016 may be implemented by flash memory and/or any other desired type of memory device. Access to the main memory 1014, 1016 of the illustrated example is controlled by a memory controller.

The processor platform 1000 of the illustrated example also includes interface circuitry 1020. The interface circuitry 1020 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface. In this example, the interface circuitry 1020 implements the example sample and conversion circuitry 302A, 302B.

In the illustrated example, one or more input devices 1022 are connected to the interface circuitry 1020. The input device(s) 1022 permit(s) a user to enter data and/or commands into the processor circuitry 1012. The input device(s) 1022 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1024 are also connected to the interface circuitry 1020 of the illustrated example. The output device(s) 1024 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1020 of the illustrated example, thus, typically includes a graphics driver card, a graphics driver chip, and/or graphics processor circuitry such as a GPU.

The interface circuitry 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1026. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1000 of the illustrated example also includes one or more mass storage devices 1028 to store software and/or data. Examples of such mass storage devices 1028 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 1032, which may be implemented by the machine readable instructions of FIGS. 8 and 9, may be stored in the mass storage device 1028, in the volatile memory 1014, in the non-volatile memory 1016, and/or on a removable non-transitory computer readable storage medium such as a CD or DVD.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve the efficiency of a computer device by implementing VTD circuitry 202 that both converts an input signal to a delay signal and begins a reset phase (e.g., the discharge of the capacitor 408A) at the same time, improving bandwidth of an ADC. The example VTD circuitry 202 also captures n samples of the input signal using n instances of a duplicated architecture, improving the SNR of the ADC through oversampling.

The term "couple" is used throughout the specification. The term may cover connections, communications, or signal paths that enable a functional relationship consistent with this description. For example, if device A (e.g., third transistor 406A) provides a signal to control device B (e.g., fourth transistor 410A) to perform an action, in a first example device A is coupled to device B, or in a second example device A is coupled to device B through intervening component C (e.g., node 420A) if intervening component C does not substantially alter the functional relationship between device A and device B such that device B is controlled by device A via the control signal provided by device A.

Numerical identifiers such as "first", "second", "third", etc. are used merely to distinguish between elements of substantially the same type in terms of structure and/or function. These identifiers as used in the detailed description do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used above and herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein (e.g., example VTD circuitry 202) as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-semiconductor FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

What is claimed is:

1. An apparatus to convert a voltage to a delay signal, the apparatus comprising:
   a first transistor having: a first gate configured to receive an analog voltage signal, a first source coupled to ground, and a first drain;
   a second transistor having: a second gate configured to receive a first control signal, a second source coupled to the first drain of the first transistor, and a second drain;
   a third transistor having: a third gate configured to receive a second control signal, a third source configured to receive a supply voltage, and a third drain coupled to the second drain in the second transistor via a first terminal;
   a capacitor having: a positive terminal coupled to the first terminal, and a negative terminal coupled to ground;
   a fourth transistor having: a fourth gate configured to receive a third control signal, a fourth source, and a fourth drain coupled to the first terminal;
   a fifth transistor having: a fifth gate configured to receive a bias voltage, a fifth source coupled to ground, and a fifth drain coupled to the fourth source of the fourth transistor;
   a sixth transistor having: a sixth gate, a sixth source coupled to ground, and a sixth drain coupled to the fourth source of the fourth transistor;
   a seventh transistor having: a seventh gate coupled to the first terminal, a seventh source configured to receive the supply voltage, and a seventh drain coupled to the sixth gate of the sixth transistor via second terminal; and
   an eighth transistor having: an eighth gate coupled to the first terminal, an eighth source coupled ground, and an eighth drain coupled to the second terminal.

2. The apparatus of claim 1, wherein the analog voltage is a single-ended signal.

3. The apparatus of claim 1, wherein:
   the second transistor, the third transistor, the capacitor, the fourth transistor, the fifth transistor, the sixth transistor, the seventh transistor, and the eighth transistor collectively form a first set of circuit elements; and
   the apparatus further includes a second set of circuit elements, the second set of circuit elements having the same components and same connections as the first set.

4. The apparatus of claim 3, wherein:
   the first set of circuit elements and the second set of circuit elements collectively form a first half circuit; and
   the apparatus further includes a second half circuit, the second half circuit having the same components and same connections as the first half circuit.

5. The apparatus of claim 4, wherein:
   the analog voltage signal includes a positive differential signal and a negative differential signal;
   the first half circuit is configured to convert the positive differential signal into a first delay signal;
   the second half circuit is configured to convert the negative differential signal into a second delay signal; and
   a time difference between a rising edge of the first delay signal and a corresponding edge of the second delay signal encodes a state of the analog voltage signal.

6. The apparatus of claim 4, wherein:
the first set of circuit elements is configured to generate a first pulse in a first delay signal based on a state of the analog voltage signal during a first sample window;
the second set of circuit elements is configured to generate a first pulse in a second delay signal based on the state of the analog voltage signal during the first sample window; and
the first set of circuit elements is further configured to generate a second pulse in the first delay signal based on a state of the analog voltage signal during a second sample window, the second sample window occurring after the first sample window.

7. The apparatus of claim 1, wherein:
the capacitor is a first capacitor; and
the apparatus further includes:
a second capacitor having: a negative terminal coupled to the gate of the first transistor, and a positive terminal;
a resistor having: a first terminal coupled to the positive terminal of the second capacitor, and a second terminal coupled to an input common mode voltage; and
a ninth transistor having: a ninth gate coupled to the positive terminal of the second capacitor, a ninth source coupled to ground, and a ninth drain coupled to the drain of the first transistor.

8. The apparatus of claim 7, wherein the second capacitor, the resistor and the ninth transistor are collectively configured to receive high frequencies from the analog voltage signal.

9. The apparatus of claim 7, wherein:
the first transistor, the second transistor, the fourth transistor, the fifth transistor, the sixth transistor, and the ninth transistor are NMOS transistors; and
the third transistor, the fourth transistor, the seventh transistor, and the eighth transistor are PMOS transistors.

10. An apparatus to convert an analog voltage to a digital signal, the apparatus comprising:
controller circuitry configured to transmit a first control signal, a second control signal, and a third control signal;
two first transistors both having: a first gate configured to receive an analog voltage signal, a first source coupled to ground, and a first drain;
two second transistors both having: a second gate configured to receive a first control signal, a second source coupled to the first drain of the two first transistors, and a second drain;
two third transistors both having: a third gate configured to receive a second control signal, a third source configured to receive a supply voltage, and a third drain coupled to the second drain in the two second transistors via a first terminal;
two capacitors both having: a positive terminal coupled to the first terminal, and a negative terminal coupled to ground;
two fourth transistors both having: a fourth gate configured to receive a third control signal, a fourth source, and a fourth drain coupled to the first terminal;
two fifth transistors both having: a fifth gate configured to receive a bias voltage, a fifth source coupled to ground, and a fifth drain coupled to the fourth source of the two fourth transistors;
two sixth transistors having: a sixth gate, a sixth source coupled to ground, and a sixth drain coupled to the fourth source of the two fourth transistors;
two seventh transistors having: a seventh gate coupled to the first terminal, a seventh source configured to receive the supply voltage, and a seventh drain coupled to the sixth gate of the two sixth transistors via a second terminal;
two eighth transistors having: an eighth gate coupled to the first terminal, an eighth source coupled ground, and an eighth drain coupled to the second terminal;
and delay to digital circuitry configured to:
obtain a first delay signal from the drain of the two first transistors;
obtain a second delay signal from the drain of the two second transistors; and
determine a value of a digital bit based on the first delay signal and the second delay signal.

11. The apparatus of claim 10, wherein:
the first delay signal includes a first pulse;
the second delay signal includes a second pulse; and
the delay to digital signal is configured to determine the value of the digital bit based on a difference in time between rising edges of the first pulse and the second pulse.

12. The apparatus of claim 10, wherein:
a first of the two first transistors, a first of the two second transistors, a first of the two third transistors, a first of the two capacitors, a first of the two fourth transistors, a first of the two fifth transistors, a first of the two sixth transistors, a first of the two seventh transistors, and a first of the two eighth transistors collectively form a first half circuit; and
a second of the two first transistors, a second of the two second transistors, a second of the two third transistors, a second of the two capacitors, a second of the two fourth transistors, a second of the two fifth transistors, a second of the two sixth transistors, a second of the two seventh transistors, and a second of the two eighth transistors collectively form a second half circuit.

13. The apparatus of claim 12, wherein:
the analog voltage signal includes a positive differential signal and a negative differential signal;
the first half circuit is configured to convert the positive differential signal into a first delay signal;
the second half circuit is configured to convert the negative differential signal into a second delay signal; and
the delay to digital circuitry determines the value of the digital bit based on the first delay signal and the second delay signal.

14. The apparatus of claim 12, wherein:
the first of the two first transistors, the first of the two second transistors, the first of the two third transistors, the first of the two capacitors, the first of the two fourth transistors, the first of the two fifth transistors, the first of the two sixth transistors, the seventh first of the two transistors, and the eighth first of the two transistors collectively form a first set of circuit elements within the first half circuit; and
the apparatus further includes a second set of circuit elements within the first half circuit, the second set of circuit elements having the same components and same connections as the first set.

15. The apparatus of claim 14, wherein:
the first set of circuit elements is configured to generate a first pulse in a first delay signal based on a state of the analog voltage signal during a first sample window;

the second set of circuit elements is configured to generate a first pulse in a second delay signal based on the state of the analog voltage signal during the first sample window; and the first set of circuit elements is further configured to generate a second pulse in the first delay signal based on a state of the analog voltage signal during a second sample window, the second sample window occurring after the first sample window.

16. The apparatus of claim 10, wherein:

the two capacitors are first capacitors; and the apparatus further includes:
- two second capacitors having: a negative terminal coupled to the gate of the two first transistors, and a positive terminal;
- two resistors having: a first terminal coupled to the positive terminal of the two second capacitors, and a second terminal coupled to an input common mode voltage; and
- two ninth transistors having: a ninth gate coupled to the positive terminal of the two second capacitors, a ninth source coupled to ground, and a ninth drain coupled to the drain of the two first transistors.

17. The apparatus of claim 16, wherein a first of the two second capacitors, the resistor and the ninth transistor are collectively configured to receive high frequencies from the analog voltage signal.

18. The apparatus of claim 16, wherein:

the two first transistors, the two second transistors, the two fourth transistors, the two fifth transistors, the two sixth transistors, and the two ninth transistors are PMOS transistors; and the two third transistors, the two fourth transistors, the two seventh transistors, and the two eighth transistors are NMOS transistors.

19. A method to convert an analog voltage to a delay signal, the method comprising:

providing, by executing instructions with a processor, a first sample signal, a first time amplification (TA) signal, and a first reset signal to first sample and conversion circuitry;

providing, by executing instructions with a processor, a second sample signal, a second TA signal, and a second reset signal to second sample and conversion circuitry;

sampling, with the first sample and conversion circuitry, a positive differential signal for an amount of time based on the first sample signal;

sampling, with the second sample and conversion circuitry, a negative differential signal for the amount of time based on the second sample signal;

after the amount of time, discharging, with the first sample and conversion circuitry, a first capacitor based on the first TA signal, the discharging to cause a rising edge in a first delay signal;

after the amount of time, discharging, with the second sample and conversion circuitry, a second based capacitor on the second TA signal, the discharging to cause a rising edge in a second delay signal;

after the first capacitor and the second capacitor have discharged, generating, with the first sample and conversion circuitry, a falling edge in the first delay signal based on the first reset signal; and after the first capacitor and the second capacitor have discharged, generating, with the second sample and conversion circuitry, a falling edge in the second delay signal based on the second reset signal.

20. The method of claim 19, wherein:

the sample is a first sample; and the method further includes causing, by executing instructions with a processor, the sample and conversion circuitry to perform a second sample of the positive differential signal and the negative differential signal, the second sample to occur after the first sample, the second sample and the first sample corresponding to a same portion of the positive differential signal and the negative differential signal.

\* \* \* \* \*